United States Patent
Chen et al.

(10) Patent No.: US 9,812,483 B2
(45) Date of Patent: Nov. 7, 2017

(54) BACK-SIDE ILLUMINATED (BSI) IMAGE SENSOR WITH GLOBAL SHUTTER SCHEME

(71) Applicant: Taiwan Semiconductor Manufacturing Co., Ltd., Hsin-Chu (TW)

(72) Inventors: Chun-Yuan Chen, Tainan (TW); Ching-Chun Wang, Tainan (TW); Dun-Nian Yaung, Taipei (TW); Shyh-Fann Ting, Tainan (TW); Wei Chuang Wu, Tainan (TW); Yen-Ting Chiang, Tainan (TW); Kuan-Tsun Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/149,497

(22) Filed: May 9, 2016

(65) Prior Publication Data
US 2017/0117315 A1    Apr. 27, 2017

Related U.S. Application Data

(60) Provisional application No. 62/246,346, filed on Oct. 26, 2015.

(51) Int. Cl.
*H01L 27/148* (2006.01)
*H01L 27/146* (2006.01)

(52) U.S. Cl.
CPC .... *H01L 27/14629* (2013.01); *H01L 27/1464* (2013.01); *H01L 27/14636* (2013.01); *H01L 27/14645* (2013.01); *H01L 27/14685* (2013.01); *H01L 27/14689* (2013.01)

(58) Field of Classification Search
CPC ...................................... H01L 27/148
See application file for complete search history.

(56) References Cited

U.S. PATENT DOCUMENTS

| | | | |
|---|---|---|---|
| 9,224,770 B2 | 12/2015 | Lin et al. | |
| 9,349,767 B2 | 5/2016 | Borthakur et al. | |
| 2009/0201395 A1* | 8/2009 | Manabe | H01L 27/1462 348/294 |

(Continued)

*Primary Examiner* — Marvin Payen
(74) *Attorney, Agent, or Firm* — Eschweiler & Potashnik, LLC

(57) ABSTRACT

In some embodiments, the present disclosure relates to a back-side image (BSI) sensor having a global shutter pixel with a reflective material that prevents contamination of a pixel-level memory node. In some embodiments, the BSI image sensor has an image sensing element arranged within a semiconductor substrate and a pixel-level memory node arranged within the semiconductor substrate at a location laterally offset from the image sensing element. A reflective material is also arranged within the semiconductor substrate at a location between the pixel-level memory node and a back-side of the semiconductor substrate. The reflective material has an aperture that overlies the image sensing element. The reflective material allows incident radiation to reach the image sensing element while preventing the incident radiation from reaching the pixel-level memory node, thereby preventing contamination of the pixel-level memory node.

20 Claims, 8 Drawing Sheets

(56) References Cited

U.S. PATENT DOCUMENTS

| | | |
|---|---|---|
| 2013/0070131 A1 | 3/2013 | Ohkubo et al. |
| 2014/0084138 A1 | 3/2014 | Machida |
| 2014/0231198 A1 | 8/2014 | Ackermann et al. |
| 2015/0001660 A1 | 1/2015 | Fukumizu et al. |
| 2015/0035100 A1 | 2/2015 | Tanida |
| 2015/0256769 A1 | 9/2015 | Kim et al. |
| 2016/0049430 A1 | 2/2016 | Nomura |

* cited by examiner

BACK-SIDE ILLUMINATED (BSI) IMAGE SENSOR WITH GLOBAL SHUTTER SCHEME

REFERENCE TO RELATED APPLICATION

This Application claims priority to U.S. Provisional Application No. 62/246,346 filed on Oct. 26, 2015, the contents of which is hereby incorporated by reference in its entirety.

BACKGROUND

Integrated circuits (IC) with image sensors are used in a wide range of modern day electronic devices, such as cameras and cell phones, for example. Complementary metal-oxide semiconductor (CMOS) devices have become popular IC image sensors, largely replacing charge-coupled devices (CCD). Compared to CCD image sensors, CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
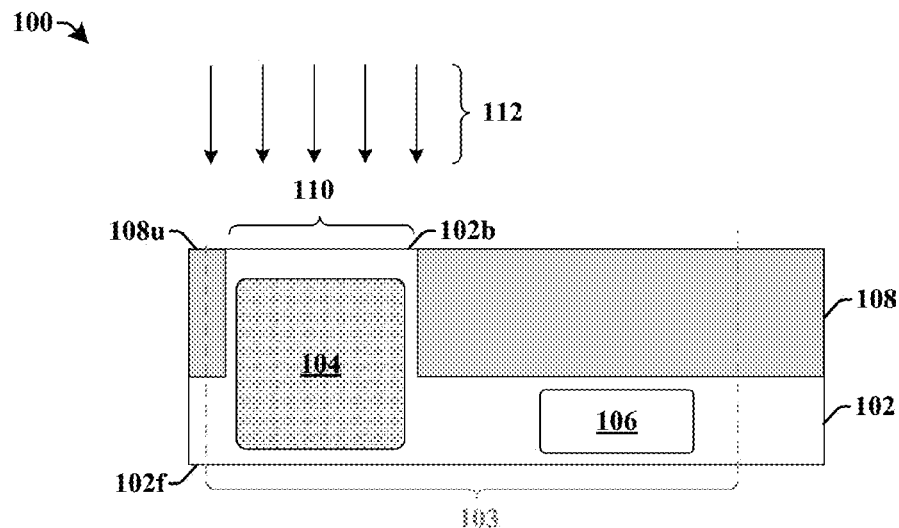
FIG. 1 illustrates a cross-sectional view of some embodiments of a back-side illuminated (BSI) image sensor having a global shutter pixel with a reflective material configured to block incident radiation from reaching a pixel-level memory node.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Global shutter pixels are often implemented by placing a memory element, in addition to a photodiode and readout circuitry, within each pixel of an image sensor array. The memory element is configured to temporarily store photo-generated charges, thereby allowing each row of the image sensor array to start an exposure at a same time. At the end of the exposure, photo-generated charge carriers are globally transferred from photodiodes to associated pixel-level memory nodes. By using pixel-level memory nodes to enable charge accumulation and readout operation at each individual pixel, the use of rolling shutter pulses can be eliminated.

Global shutter pixels are often implemented as front-side illuminated (FSI) image sensors. This is because FSI image sensors have metal interconnect layers overlying a pixel region. The metal interconnect layers can block incident radiation from striking a pixel-level memory node, thereby preventing degradation of global shutter efficiency (GSE) due to the generation of parasitic electron-hole pairs within the pixel-level memory node (i.e., preventing the parasitic electron-hole pairs from contaminating charges stored in the pixel-level memory node). Back-side illuminated (BSI) image sensors do not have overlying metal interconnect layers to shield a pixel-level memory node from incident radiation, thereby causing BSI image sensors to have a disadvantage in global shutter pixel configurations. However, BSI image sensors offer better quantum efficiency than that of FSI image sensors since they do not have metal interconnect layers within an optical path of a photodiode.

The present disclosure relates to a back-side illuminated (BSI) image sensor having a global shutter pixel with a reflective material configured to prevent contamination of a pixel-level memory node. In some embodiments, the BSI image sensor comprises an image sensing element arranged within a semiconductor substrate and a pixel-level memory node arranged within the semiconductor substrate at a location laterally offset from the image sensing element. A reflective material is also arranged within the semiconductor substrate at a location between the pixel-level memory node and a plane extending along a back-side of the semiconductor substrate. The reflective material has an aperture that overlies the image sensing element. The reflective material is configured to allow incident radiation to reach the image sensing element while preventing the incident radiation from reaching the pixel-level memory node, thereby preventing contamination of the pixel-level memory node.

FIG. 1 illustrates a cross-sectional view of some embodiments of a back-side illuminated (BSI) image sensor 100 having a global shutter pixel with a reflective material configured to block incident radiation from reaching a pixel-level memory node.

The BSI image sensor 100 comprises a semiconductor substrate 102 having a pixel region 103. The pixel region 103 comprises an image sensing element 104 configured to convert incident radiation 112 (e.g., photons) into an electric signal (e.g., electrons and/or holes). In some embodiments, the image sensing element 104 may comprise a photodiode having a P-N junction (i.e., a junction between a first region having a p-type doping and an abutting second region having an n-type doping).

A pixel-level memory node 106 is arranged within the semiconductor substrate 102 at a location that is laterally offset from the image sensing element 104. The pixel-level memory node 106 is configured to store charge carriers (e.g., electrons or holes) generated within the image sensing element 104. In some embodiments, the pixel-level memory node 106 may comprise a highly doped region having a doping type opposite the semiconductor substrate 102. In some embodiments, the highly doped region may be vertically separated from a front-side 102f of the semiconductor substrate 102.

A reflective material 108 is arranged between a plane extending along the back-side 102b of the semiconductor substrate 102 and the pixel-level memory node 106. In some embodiments, the reflective material 108 may have a horizontal surface (e.g., upper surface 108u) that is co-planar with the back-side 102b of the semiconductor substrate 102. The reflective material 108 comprises an aperture 110 arranged over the image sensing element 104. In some embodiments, the image sensing element 104 extends to within the aperture 110 in the reflective material 108 so that the image sensing element 104 is laterally separated from the reflective material 108 by the semiconductor substrate 102. In such embodiments, the image sensing element 104 is closer to the back-side 102b of the semiconductor substrate 102 than the pixel-level memory node 106.

The reflective material 108 is configured to the reflect incident radiation 112. This prevents the incident radiation 112 from reaching the pixel-level memory node 106, while the aperture 110 allows for the incident radiation 112 to reach the image sensing element 104. By blocking incident radiation 112 from the pixel-level memory node 106, the reflective material 108 allows for the BSI image sensor 100 to have a global shutter pixel with good quantum efficiency while avoiding contamination of the pixel-level memory node 106 due to generation of parasitic electron-hole pair.

Figure 2:
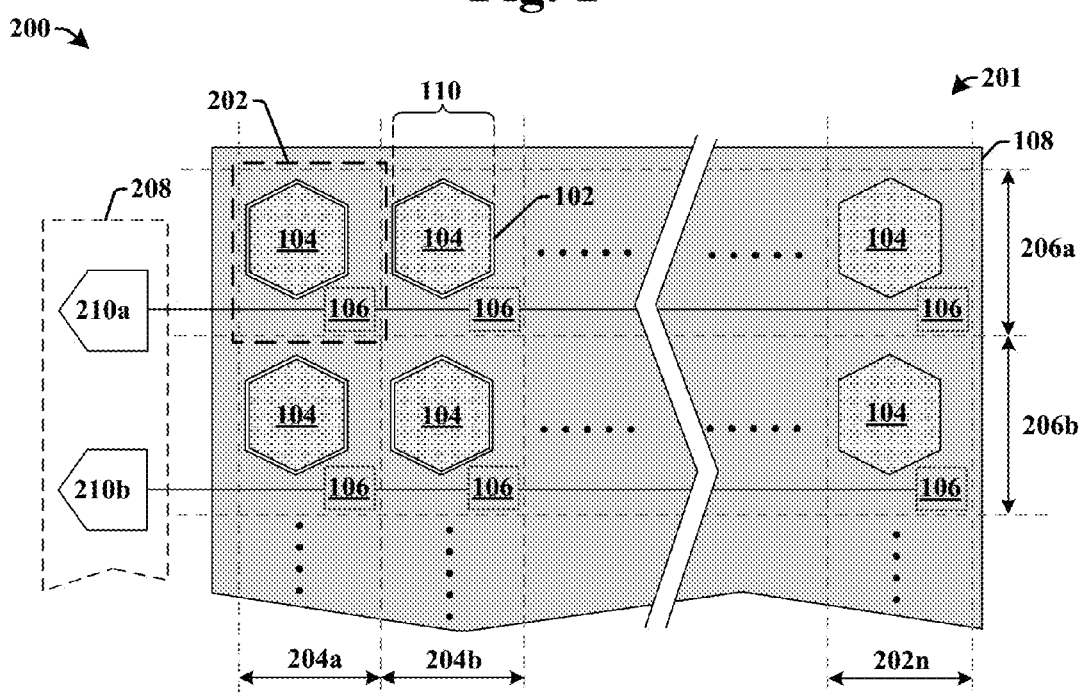
FIG. 2 illustrates a top-view of some embodiments of a BSI image sensor having a global shutter pixel with a reflective material.

FIG. 2 illustrates a top-view of some embodiments of a BSI image sensor 200 having a global shutter pixel with a reflective material.

The BSI image sensor 200 comprises a plurality of pixel regions 202 arranged within a semiconductor substrate in an array 201 comprising a plurality of columns 204a-204n and a plurality of rows 206a-206b. Each of the plurality of pixel regions 202 comprise a reflective material 108 arranged along a back-side of the semiconductor substrate. An aperture 110 extends through the reflective material 108 at a position that overlies an image sensing element 104, so that incident radiation is able to reach the image sensing elements 104. In various embodiments, the aperture 110 within the reflective material 108 may have any shape. For example, in some embodiments, the aperture 110 may have a shape of a polygon (e.g., a hexagonal shape, a square shape, etc.). In other embodiments, the aperture 110 may have an alternative shape, such as a circular shape, or an amorphous shape, for example.

Respective ones of the plurality of pixel regions 202 further comprise a pixel-level memory node 106. The pixel-level memory node 106 is disposed below the reflective material 108, so that the reflective material 108 blocks the pixel-level memory node 106 from incident radiation (e.g., light).

The array 201 is coupled to readout circuitry 208 configured to read signals from the plurality of pixel regions 202 within the array 201. In some embodiments, the readout circuitry 208 may comprise a plurality of analog-to-digital converters (ADCs) 210a-210b coupled to respective rows of pixels within the array 201. The ADCs 210a-210b are configured to convert the signals from the plurality of pixel regions 202 to a digital signal that may be further provided to a digital signal processing unit (not shown).

During operation, pixel regions 202 within each of the plurality of columns 204a-204n and/or rows 206a-206b are configured to start an exposure at a same time. Once the exposure has commenced, photo-generated charge carriers are globally transferred from the image sensing element 104 of the plurality of pixel regions 202 to the pixel-level memory nodes 106 within the plurality of pixel regions 202. The charges are then read out from the pixel-level memory nodes 106 within a row 206a-206b. Therefore, the pixel-level memory node 106 allows each of the plurality of pixel regions 202 to be exposed simultaneously.

Figure 3:
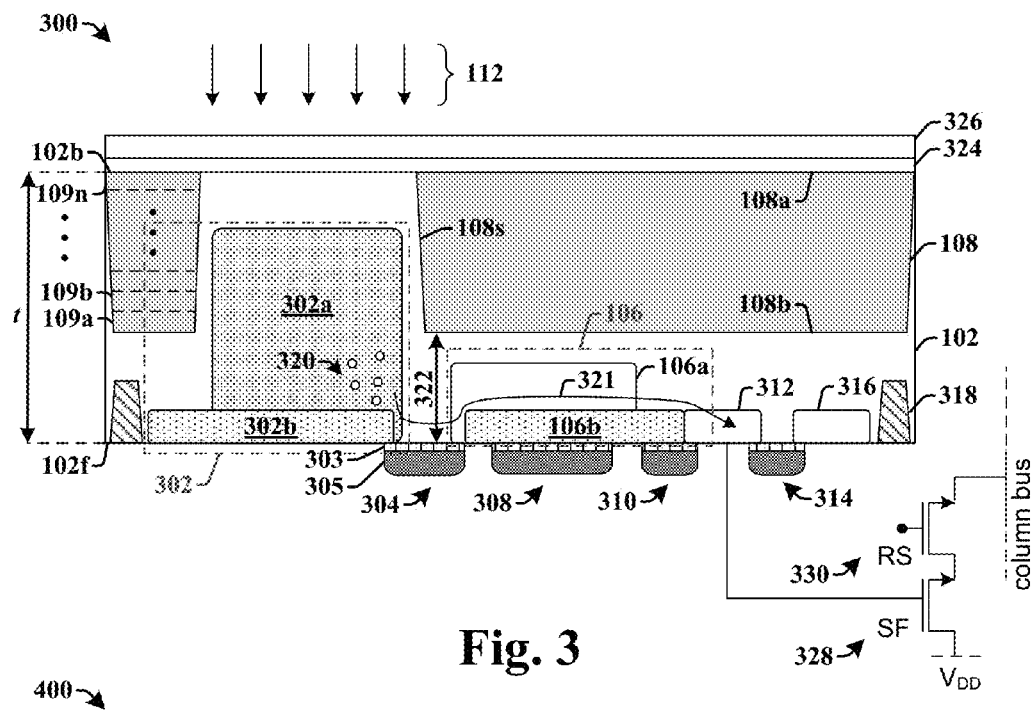
FIG. 3 illustrates a cross-sectional view of some additional embodiments of a BSI-CMOS image sensor having a global shutter pixel with a reflective material.

FIG. 3 illustrates a cross-sectional view of some additional embodiments of a back-side illuminated CMOS (BSI-CMOS) image sensor 300 having a global shutter pixel with a reflective material.

The BSI-CMOS image sensor 300 comprises a pixel region 301 arranged within a semiconductor substrate 102. In some embodiments, the pixel region 301 may be isolated from adjacent pixel regions by one or more isolation structures 318 (e.g., shallow trench isolation regions) arranged on opposing sides of the pixel region 301. The one or more isolation structures 318 may comprise a dielectric material arranged within a trench in a front-side 102f of the semiconductor substrate 102.

The pixel region 301 comprises a photodiode 302 and a pixel-level memory node 106. The photodiode 302 is configured to generate charge carriers 320 (i.e., electron-hole pairs) from incident radiation 112. In some embodiments, the photodiode 302 may comprise a first region 302a with a first doping type (e.g., n-type doping) and a second region 302b with a second doping type (e.g., p-type doping) that is different than the first doping type. In some embodiments, the pixel-level memory node 106 may comprise a first region 106a with a first doping type (e.g., n-type doping) and a second region 106b with a second doping type (e.g., p-type doping) that is different than the first doping type. The second region 106b is configured to confine charge carriers 320 within the first region 106a, thereby improving storage (e.g., reducing leakage) of the charge carriers 320 within the pixel-level memory node 106. In some embodiments, the photodiode 302 and/or the pixel-level memory node 106 may have regions with a doping concentration greater than or equal to approximately 5e15 atoms/cm$^3$. In some embodiments, the semiconductor substrate 102 may have the second doping type. In some embodiments, the pixel-level memory node 106 has a storage capacity that is greater than or equal to that of the photodiode 302.

The pixel-level memory node 106 is separated from a plane extending along a back-side 102b of the semiconductor substrate 102 by way of a reflective material 108 within the semiconductor substrate 102. In some embodiments, the reflective material 108 may have an angled sidewall 108s that decreases a width of the reflective material 108 as a distance from the back-side 102b of the semiconductor substrate 102 increases. In some embodiments, the reflective material 108 may have an upper surface 108a and a lower surface 108b. The upper surface 108a is substantially co-planar with a back-side 102b of the semiconductor substrate 102. The lower surface 108b is separated from a front-side 102f of the semiconductor substrate 102 by a distance 322. In some embodiments, the distance 322 is in a range of between a thickness t of the semiconductor substrate 102 and approximately 0.01 um. In various embodiments, the reflective material 108 may comprise a metal (e.g., such as aluminum or copper) or a multi-layer reflective film comprising a plurality of layers 109a-109n having separate materials (e.g., having alternating layers of silicon and ruthenium).

A first transfer transistor gate 304 is arranged along the front-side 102f of the semiconductor substrate 102. The first transfer transistor gate 304 comprises a gate dielectric layer 303 disposed over the front-side 102f of the semiconductor substrate 102 and a gate electrode 305 arranged onto the gate dielectric layer 303. In some embodiments, sidewall spacers (not shown) are arranged on opposing sides of the gate dielectric layer 303 and the gate electrode 305. The first transfer transistor gate 304 is laterally arranged between the photodiode 302 and the pixel-level memory node 106 and is configured to control the flow of the charge carriers 320 from the photodiode 302 to the pixel-level memory node 106. A memory transistor gate 308 is arranged over the pixel-level memory node 106, and a second transfer transistor gate 310 is arranged between the pixel-level memory node 106 and a floating diffusion node 312. The memory transistor gate 308 and the second transfer transistor gate 310 control the flow of the charge carriers 320 from the pixel-level memory node 106 to the floating diffusion node 312. Therefore, the first transfer transistor gate 304, the memory transistor gate 308, and the second transfer transistor gate 310 collectively control the flow of charge carriers 320 along a path 321 extending between the photodiode 302 and the floating diffusion node 312.

The floating diffusion node 312 is further coupled to a reset transistor (comprising a reset transistor gate 314 and well region 316) and a source follower transistor 328. The reset transistor is configured to reset the photodiode 302 between exposure periods. If the charge level is sufficiently high within the floating diffusion node 312, the source follower transistor 328 is activated and charges are selectively output according to operation of a row select transistor 330 used for addressing.

A passivation layer 324 is arranged onto a back-side 102b of the semiconductor substrate 102, and a layer of dielectric material 326 is arranged onto the passivation layer 324. In some embodiments, the passivation layer 324 may comprise an anti-reflective coating (ARC), such as a bottom resist anti-reflective coating (BARC), for example. In other embodiments, the passivation layer 324 may comprise an organic polymer or a metallic oxide. In some embodiments, the layer of dielectric material 326 may comprise an oxide or high-k dielectric layer such as hafnium oxide (HfO), hafnium silicon oxide (HfSiO), hafnium aluminum oxide (HfAlO), or hafnium tantalum oxide (HMO), for example.

Figure 4:
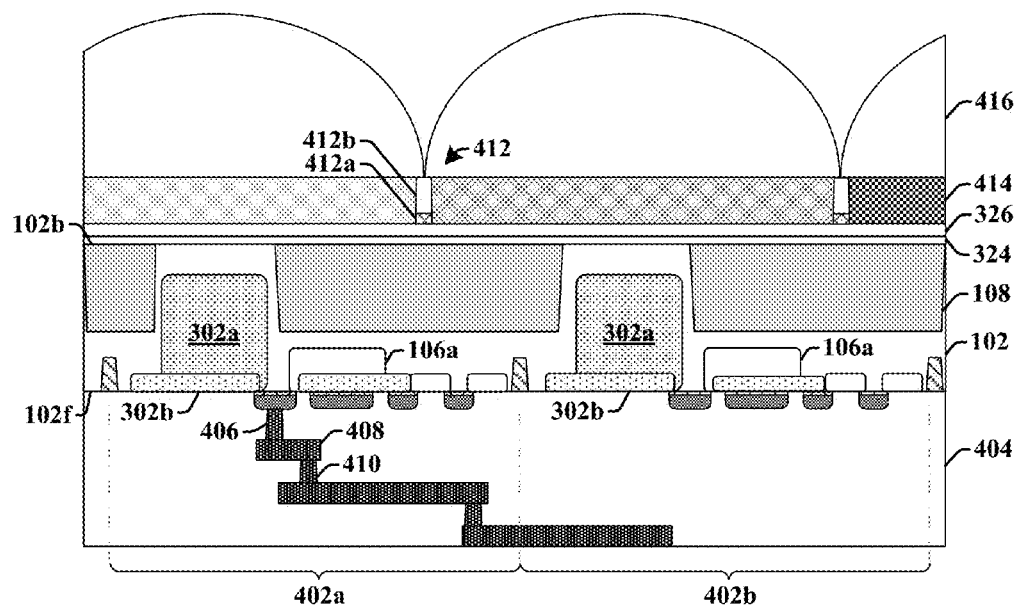
FIG. 4 illustrates a cross-sectional view of some additional embodiments of a BSI-CMOS image sensor having a global shutter pixel with a reflective material.

FIG. 4 illustrates a cross-sectional view of some additional embodiments of a BSI-CMOS image sensor 400 having a global shutter pixel with a reflective material.

The BSI-CMOS image sensor 400 comprises a plurality of pixel regions 402a-402b arranged within a semiconductor substrate 102. A dielectric structure 404 is arranged along a front-side 102f of the semiconductor substrate 102. The dielectric structure 404 comprises one or more ILD layers. In various embodiments, the ILD layers may comprise one or more of a low-k dielectric layer (i.e., a dielectric with a dielectric constant less than about 3.9), an ultra low-k dielectric layer, or an oxide (e.g., silicon oxide). Conductive contacts 406 are arranged within the dielectric structure 404. The conductive contacts 406 extend from the gate electrodes to metal wire layers 408 that are vertically connected by way of metal vias 410. In various embodiments, the conductive contacts 406 may comprise a conductive metal such as copper or tungsten, for example. In various embodiments, the metal wire layers 408 and metal vias 410 may comprise a conductive metal such as copper or aluminum, for example.

A grid structure 412 is arranged over a layer of dielectric material 326 disposed over a back-side 102b of the semiconductor substrate 102. The grid structure 412 laterally surrounds one or more color filters 414 disposed over the layer of dielectric material 326. In some embodiments, the grid structure 412 may comprise a stacked structure having a dielectric material 412a (e.g., silicon nitride) and an overlying metal 412b. The grid structure 412 forms a framework that defines a plurality of openings located over underlying photodiodes 302. The color filters 414 are respectively configured to transmit specific wavelengths of radiation. For example, a first color filter (e.g., a red color filter) may transmit light having wavelengths within a first range, while a second color filter (e.g., a green color filter) may transmit light having wavelengths within a second range different than the first range.

A plurality of micro-lenses 416 are arranged over the plurality of color filters 414. The plurality of micro-lenses 416 are respectively aligned with the color filters 414 and overlie the photodiodes 302. The micro-lenses 416 are configured to focus incident radiation (e.g., light) towards the photodiodes 302. In some embodiments, the plurality of micro-lenses 416 have a substantially flat bottom surface abutting the color filters 414. Furthermore, the plurality of micro-lenses 416 may respectively comprise a curved upper surface. In various embodiments, the micro-lenses 416 may have a curvature configured to focus the radiation onto a center of an underlying photodiode 302.

FIGS. 5-13 illustrate cross-sectional views showing some embodiments of a method of forming a BSI image sensor having a global shutter pixel with a reflective material configured to reflect incident radiation.

As shown in cross-sectional view 500, a semiconductor substrate 502 is provided. The semiconductor substrate 502 may be any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. The semiconductor substrate 502 may comprise an intrinsically doped semiconductor substrate having a first doping type (e.g., an n-type doping or a p-type doping).

A plurality of image sensing elements 104 are formed within the semiconductor substrate 502. In some embodiments, the plurality of image sensing elements 104 may comprise photodiodes. In such embodiments, the photodiode may be formed by selectively implanting the semiconductor substrate 502 with one or more dopant species 504 to form one or more doped regions 302a-302b within the semiconductor substrate 502. For example, in some embodiments, a first implantation process is performed according to a first masking layer 506 (e.g., photoresist) arranged along a front-side 502f of the semiconductor substrate 502 to form a first region 302a having a first doping type, and a second subsequent implantation process is performed according to a second masking layer (not shown) to form an abutting second region 302b having a second doping type different than the first doping type.

In some embodiments, one or more isolation structures 318 (e.g., shallow trench isolation regions) may be formed within the front-side 502f of the semiconductor substrate 502 on opposing sides of a pixel region 301. The one or more isolation structures 318 may be formed by selectively etching the front-side 502f of the semiconductor substrate 502 to form shallow-trenches and subsequently forming a dielectric material (e.g., an oxide) within the shallow-trenches. In some embodiments, the one or more isolation structures 318 may be formed prior to formation of the plurality of image sensing elements 104.

As shown in cross-sectional view 600, a pixel-level memory node 106 is formed within the semiconductor substrate 502. In some embodiments, the pixel-level memory node 106 may be formed by selectively implanting the semiconductor substrate 502 with one or more dopant species 602 to form one or more doped regions within the semiconductor substrate 502. For example, in some embodiments, a first implantation process is performed according to a first masking layer 604 (e.g., photoresist) arranged along the front-side 502f of the semiconductor substrate 502 to form a first region 106a having a first doping type, and a second subsequent implantation process is performed according to a second masking layer (not shown) to form an abutting second region 106b having a second doping type different than the first doping type.

As shown in cross-sectional view 700, a plurality of source/drain regions, 312 and 316, are formed within the front-side 502f of the semiconductor substrate 502. The plurality of source/drain regions, 312 and 316, are formed by a series of implantation processes.

As shown in cross-sectional view 800, a first transfer transistor gate 304, a memory transistor gate 308, a second transfer transistor gate 310, and a reset transistor gate 314 are formed along a front-side 502f of the semiconductor substrate 502. The first transfer transistor gate 304, the memory transistor gate 308, the second transfer transistor gate 310, and the reset transistor gate 314 may be formed by depositing a gate dielectric film and a gate electrode film over the semiconductor substrate 502. The gate dielectric film and the gate electrode film are subsequently patterned to form gate dielectric layers 303 and gate electrodes 305.

As shown in cross-sectional view 900, a plurality of metal interconnect layers 406-410 are formed within a dielectric structure 404 formed over the front-side 502f of the semiconductor substrate 502. In some embodiments, the plurality of metal interconnect layers 406-410 may be formed by forming an ILD layer 902 over the front-side 502f of the semiconductor substrate 502. The ILD layer 902 is subsequently etched to form via holes and/or metal trenches. The via holes and/or metal trenches are then filled with a conductive material to form one or more of the plurality of metal interconnect layers 406-410. In some embodiments, the ILD layer 902 may be deposited by a physical vapor deposition technique (e.g., PVD, CVD, etc.). The plurality of metal interconnect layers 406-410 may be formed using a deposition process and/or a plating process (e.g., electroplating, electro-less plating, etc.). In various embodiments, the plurality of metal interconnect layers 406-410 may comprise tungsten, copper, or an aluminum-copper alloy, for example.

As shown in cross-sectional view 1000, the dielectric structure 404 is bonded to a handle substrate 1002. In some embodiments, the bonding process may use an intermediate bonding oxide layer (not shown) arranged between the dielectric structure 404 and the handle substrate 1002. In some embodiments, the bonding process may comprise a fusion bonding process. In some embodiments, the handle substrate 1002 may comprise a silicon wafer.

After bonding the dielectric structure 404 to the handle substrate 1002, the semiconductor substrate 502 is thinned. Thinning the semiconductor substrate 502 reduces a thickness of the substrate from a first thickness $t_1$ to a second thickness $t_2$. Reducing the thickness improves transmission of radiation to pass through the back-side 102b of the semiconductor substrate 102 to the image sensing elements 104. In some embodiments, the semiconductor substrate 502 may be thinned by etching the back-side 502b of the semiconductor substrate 502. In other embodiments, the semiconductor substrate 502 may be thinned by mechanically grinding the back-side 502b of the semiconductor substrate 502.

As shown in cross-sectional view 1100, a back-side of the semiconductor substrate 102 may be selectively etched to form trenches 1102 overlying the pixel-level memory node 106. The trenches 1102 may extend along opposing sides of the image sensing elements 104. In some embodiments, the back-side 102b of the semiconductor substrate 102 may be selectively exposed to an etchant 1104 according to a masking layer 1106. In various embodiments, the etchant 1104 may comprise a dry etchant (e.g., an ion bombardment) and/or a wet etchant (e.g., Tetramethylammonium hydroxide (TMAH), potassium hydroxide (KOH), etc.).

As shown in cross-sectional view 1200, a reflective material 108 is formed within the trenches 1102. In some embodiments, the reflective material 108 may comprise a metal, such as copper or aluminum, for example. In such embodiments, the reflective material 108 may be deposited by way of a vapor deposition process (e.g., PVD, CVD, PE-CVD, etc.) and/or a plating process (e.g., an electroplating process or an electro-less plating process). In other embodiments, the reflective material 108 may comprise a multi-layer reflective film (e.g., comprising alternating layers of silicon and ruthenium) formed by a series of deposition processes. A planarization process may be performed (along line 1202) after forming the reflective material within the trenches 1102 to remove a portion of reflective material 108 outside of the trenches 1102. In some embodiments, the planarization process may comprise a chemical mechanical polishing (CMP) process or an etching process.

As shown in cross-sectional view 1300, a passivation layer 324 is formed onto the back-side 102b of the semiconductor substrate 102 and onto the reflective material 108. In some embodiments, the passivation layer 324 may comprise an anti-reflective coating (ARC) layer. A layer of dielectric material 326 is formed over the passivation layer 324. In some embodiments, the layer of dielectric material 316 may comprise an oxide. In some embodiments, the passivation layer 324 and the layer of dielectric material 326 may be deposited by way of a vapor deposition process (e.g., chemical vapor deposition (CVD), physical vapor deposition (PVD), plasma enhanced chemical vapor deposition (PECVD), etc.). In some embodiments, after deposition of the passivation layer 324, and before formation of the layer of dielectric material 326, a high temperature bake may be performed.

A grid structure 412 is subsequently formed over the layer of dielectric material 326. The grid structure 412 may be formed by forming a dielectric 412a (e.g., silicon-dioxide (SiO$_2$)) onto an upper surface of the layer of dielectric material 326 and a metal 412b over the dielectric 412a. The dielectric 412a may be formed using a deposition process. The metal 412b may be formed using a deposition process and/or a plating process (e.g., electroplating, electro-less plating, etc.). In various embodiments, the metal 412b may comprise tungsten, copper, or aluminum copper, for example. The dielectric 412a and the metal 412b are then etched to define openings 1302 within the grid structure 412.

As shown in cross-sectional view 1400, a plurality of color filters 414 are formed to fill the openings 1302. In some embodiments, the plurality of color filters 414 may be formed by forming a color filter layer and patterning the color filter layer. The color filter layer is formed so as to fill exposed regions of the openings 1302. The color filter layer is formed of a material that allows for the transmission of radiation (e.g., light) having a specific range of wavelength, while blocking light of wavelengths outside of the specified range. The patterning may be performed by forming a photoresist layer with a pattern over the color filter layer, applying an etchant to the color filter layer according to the pattern of the photoresist layer, and removing the pattern photoresist layer. In some embodiments, the color filter layer is planarized subsequent to formation.

A plurality of micro-lenses 416 are formed over the plurality of color filters 414. In some embodiments, the micro-lenses 416 may be formed by depositing a micro-lens material above the plurality of color filters 414 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 416 are then formed by selectively etching the micro-lens material according to the micro-lens template.

Figure 14:
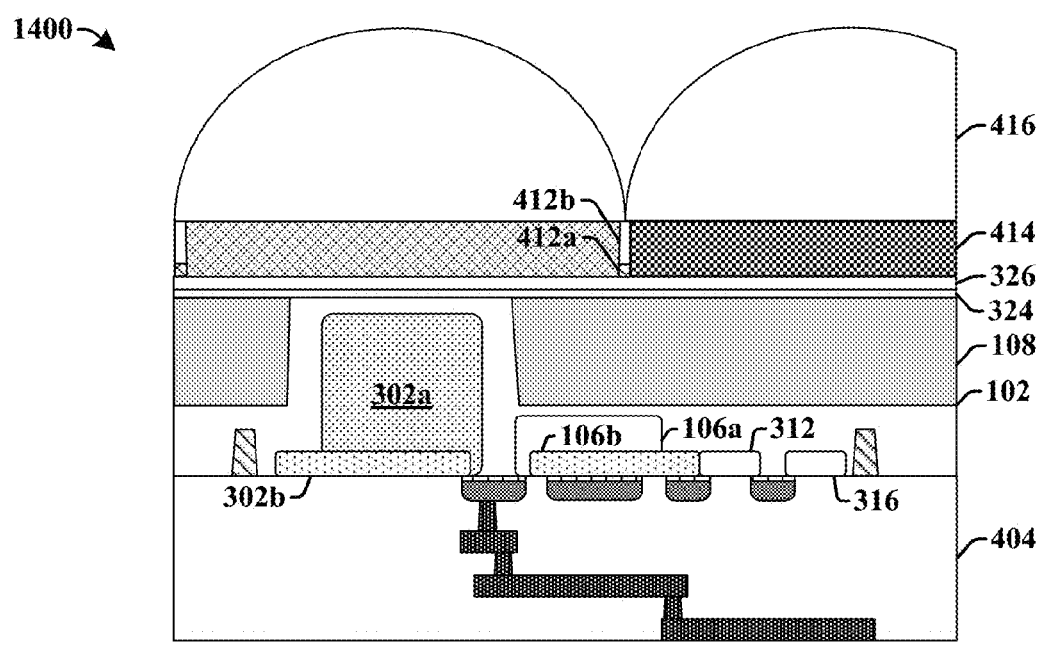
Figure 15:
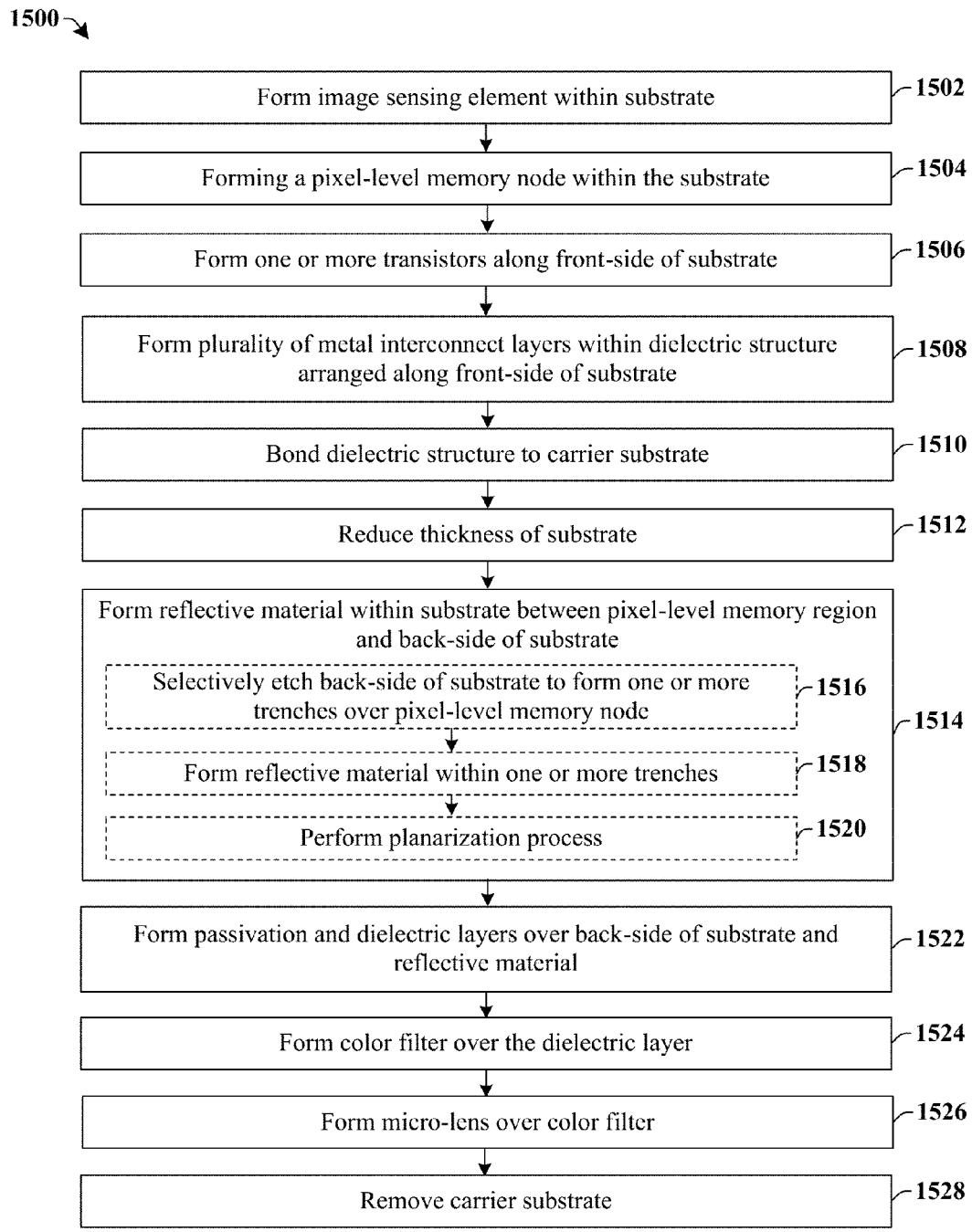
FIG. 15 illustrates a flow diagram of some embodiments of a method of forming a BSI image sensor having a global shutter pixel with a reflective material.

FIG. 15 illustrates a flow diagram of some embodiments of a method of forming a BSI image sensor having a global shutter pixel with a reflective material. Although method 1500 is described in relation to FIGS. 5-14, it will be appreciated that the method 1500 is not limited to such structures, but instead may stand alone as a method independent of the structures.

Furthermore, while the disclosed method 1500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5:
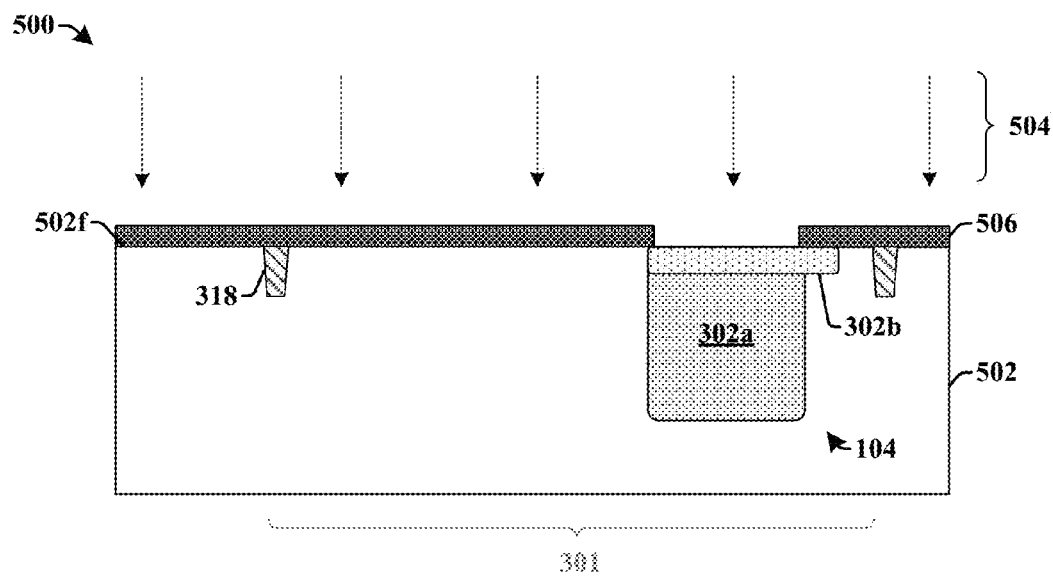
FIGS. 5-14 illustrate cross-sectional views showing some embodiments of a method of forming a BSI image sensor having a global shutter pixel with a reflective material.

At 1502, an image sensing element is formed within a substrate. In some embodiments, the image sensing element comprises a photodiode formed by performing one or more implantation processes within a front-side of the substrate. FIG. 5 illustrates some embodiments corresponding to act 1502.

Figure 6:
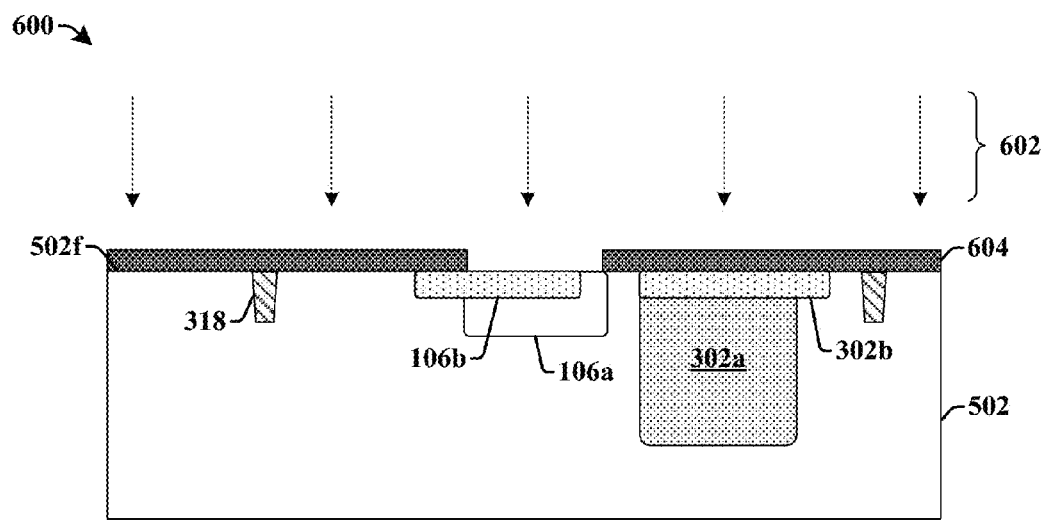

At 1504, a pixel-level memory node is formed within the substrate. In some embodiments, the pixel-level memory node comprises one or more doped regions formed by performing one or more implantation processes within the front-side of the substrate. FIG. 6 illustrates some embodiments corresponding to act 1504.

Figure 7:
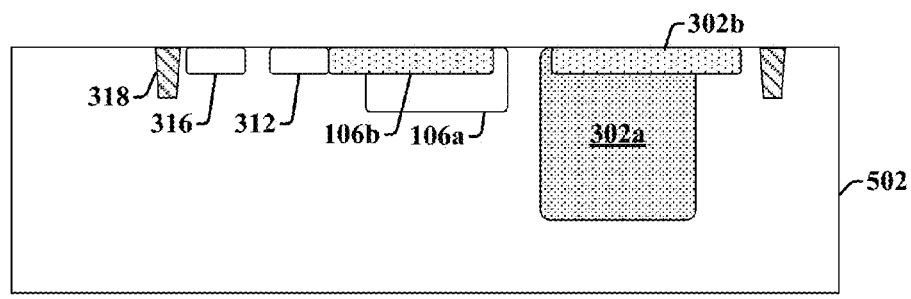
Figure 8:
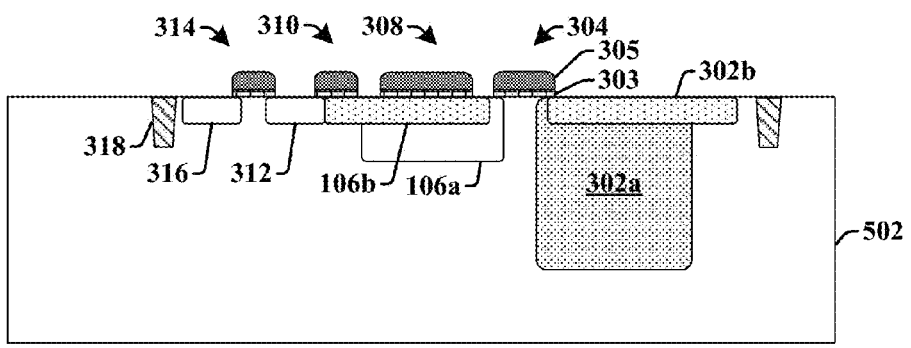

At 1506, one or more transistors are formed along the front-side of the substrate. FIGS. 7-8 illustrate some embodiments corresponding to act 1506.

Figure 9:
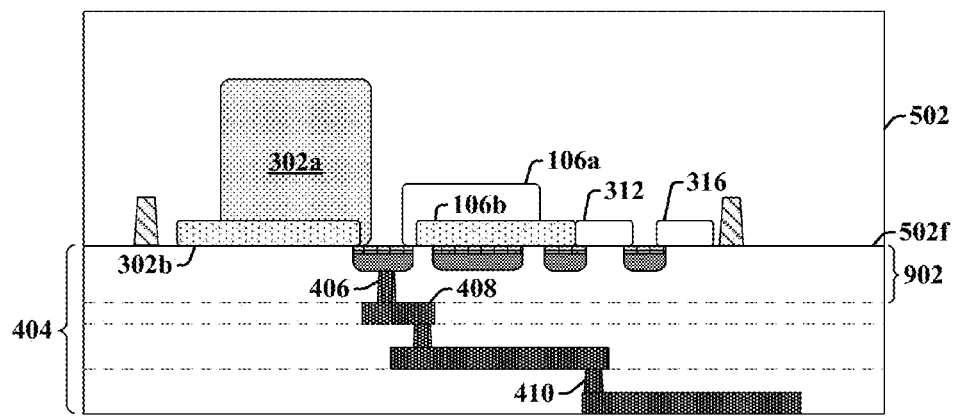

At 1508, a plurality of metal interconnect layers are formed within a dielectric structure arranged along the front-side of the substrate. FIG. 9 illustrates some embodiments corresponding to act 1508.

Figure 10:
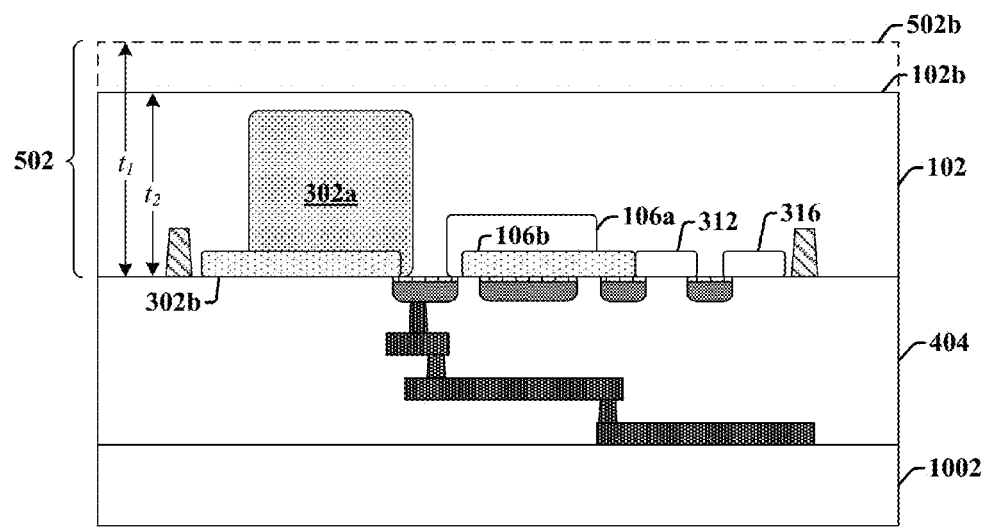

At 1510, the dielectric structure is bonded to a carrier substrate. FIG. 10 illustrates some embodiments corresponding to act 1510.

At 1512, a thickness of the substrate is reduced. FIG. 10 illustrates some embodiments corresponding to act 1512.

Figure 11:
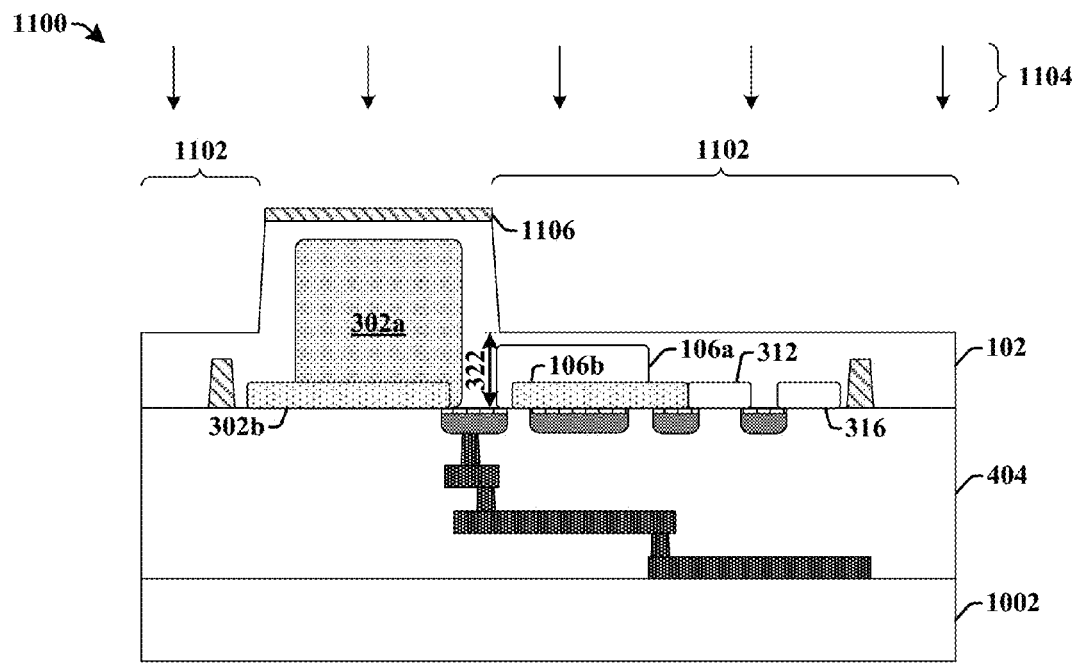
Figure 12:
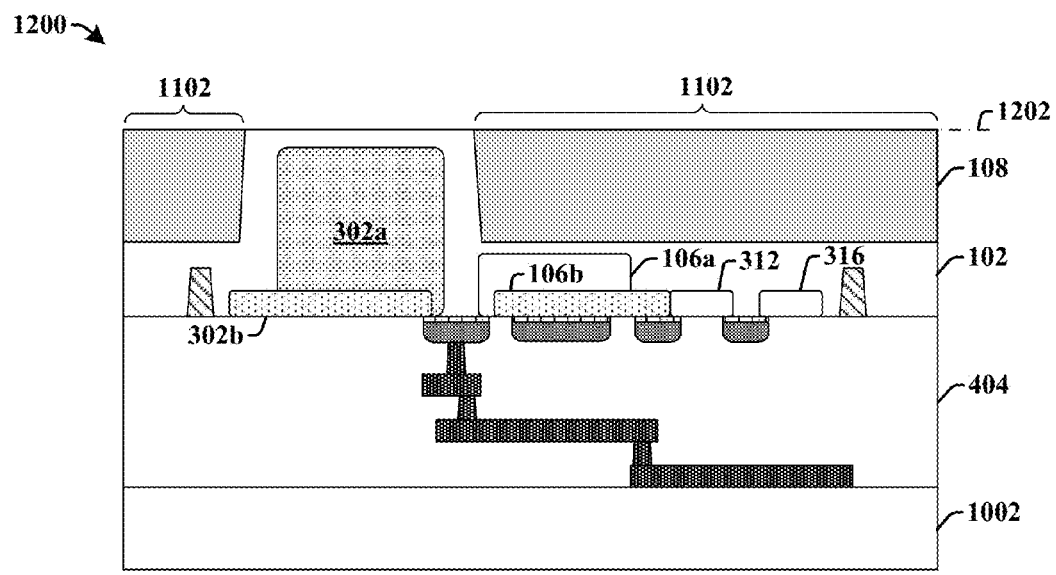

At 1514, a reflective material is formed within the substrate between the pixel-level memory node and a back-side of the substrate. In some embodiments, act 1514 may be performed according to acts 1516-1520. For example, at 1516 the back-side of the substrate is selectively etched to form one or more trenches over the pixel-level memory node. At 1518, a reflective material is formed within the one or more trenches. At 1520, a planarization process is performed to remove excess of the reflective material from outside of the one or more trenches. FIGS. 11-12 illustrate some embodiments corresponding to act 1514.

Figure 13:
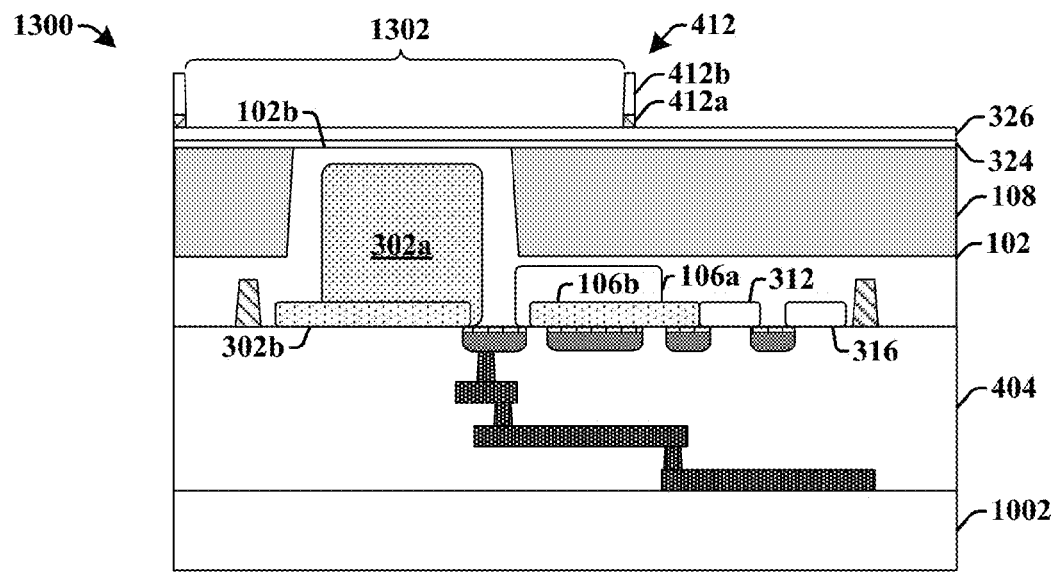

At 1522, a passivation layer and a layer of dielectric material are formed over the back-side of the substrate and the reflective material. FIG. 13 illustrates some embodiments corresponding to act 1522.

At 1524, a color filter is formed over the layer of dielectric material. FIG. 13 illustrates some embodiments corresponding to act 1524.

At 1526, a micro-lens is formed over the color filter. FIG. 14 illustrates some embodiments corresponding to act 1526.

At 1528, the carrier substrate is removed. FIG. 14 illustrates some embodiments corresponding to act 1528.

Therefore, the present disclosure relates to a back-side illuminated (BSI) image sensor having a global shutter pixel with a reflective material configured to prevent light contamination of a pixel-level memory node.

In some embodiments, the present disclosure relates to a back-side illuminated (BSI) image sensor. The BSI image sensor comprises an image sensing element arranged within a semiconductor substrate, and a pixel-level memory node arranged within the semiconductor substrate at a location laterally offset from the image sensing element. The BSI image sensor further comprises a reflective material arranged within the semiconductor substrate at a location between the pixel-level memory node and a plane extending along a back-side of the semiconductor substrate and having an aperture that overlies the image sensing element.

In other embodiments, the present disclosure relates to a BSI image sensor. The BSI image sensor comprises a photodiode comprising a first region having a first doping type arranged within a semiconductor substrate having a second doping type, and a pixel-level memory node comprising a second region having the first doping type arranged within the semiconductor substrate at a location laterally offset from the first region. The BSI image sensor further comprises a reflective material arranged within the semiconductor substrate at a location between the pixel-level memory node and a plane extending along a back-side of the semiconductor substrate. The reflective material has a sidewall that is separated from the first region by the semiconductor substrate. The BSI image sensor further comprises a transfer transistor gate arranged along a front-side of the semiconductor substrate, which opposes the back-side of the semiconductor substrate, at a location laterally between the first region and the second region.

In yet other embodiments, the present disclosure relates to a method of forming method a BSI image sensor. The method comprises forming an image sensing element within a substrate, and forming a pixel-level memory node at a position within the substrate that is laterally offset from the image sensing element. The method further comprises etching a back-side of the substrate to form one or more trenches that are laterally separated from the image sensing element by the substrate and that vertically overlie the pixel-level memory node, and forming a reflective material within the one or more trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back-side illuminated (BSI) image sensor, comprising:
   an image sensing element arranged within a semiconductor substrate;
   a pixel-level memory node arranged within the semiconductor substrate at a location laterally offset from the image sensing element; and
   a reflective material arranged within the semiconductor substrate at a location between the pixel-level memory node and a plane extending along a back-side of the semiconductor substrate and having an aperture that overlies the image sensing element.

2. The BSI image sensor of claim 1, wherein the reflective material has a horizontal surface that is co-planar with the back-side of the semiconductor substrate.

3. The BSI image sensor of claim 1, wherein the reflective material is laterally separated from the image sensing element by the semiconductor substrate.

4. The BSI image sensor of claim 1, wherein the reflective material comprises a metal or a multi-layer reflective film.

5. The BSI image sensor of claim 1, wherein the reflective material has an angled sidewall that decreases a width of the reflective material as a distance from the back-side of the semiconductor substrate increases.

6. The BSI image sensor of claim 1,
   wherein the image sensing element comprises a photodiode with a first region within the semiconductor substrate having a first doping type that is different than a second doping type of the semiconductor substrate; and
   wherein the pixel-level memory node comprises a second region within the semiconductor substrate having the first doping type.

7. The BSI image sensor of claim 6, further comprising:
   a first transfer transistor gate arranged along a front-side of the semiconductor substrate laterally between the first region and the second region.

8. The BSI image sensor of claim 7, further comprising:
   a memory transistor gate arranged along the front-side of the semiconductor substrate over the second region.

9. The BSI image sensor of claim 8, further comprising:
   a second transfer transistor gate arranged along the front-side of the semiconductor substrate at a position laterally between the memory transistor gate and a floating diffusion node arranged within the semiconductor substrate.

10. The BSI image sensor of claim 1, further comprising:
    a plurality of metal interconnect layers arranged within a dielectric structure disposed along a front-side of the semiconductor substrate opposing the back-side of the semiconductor substrate.

11. A back-side illuminated (BSI) image sensor, comprising:
    a photodiode comprising a first region having a first doping type arranged within a semiconductor substrate having a second doping type;
    a pixel-level memory node comprising a second region having the first doping type arranged within the semiconductor substrate at a location laterally offset from the first region;
    a reflective material arranged within the semiconductor substrate at a location between the pixel-level memory node and a plane extending along a back-side of the semiconductor substrate, wherein the reflective material has sidewall that is separated from the first region by the semiconductor substrate; and
    a transfer transistor gate arranged along a front-side of the semiconductor substrate, which opposes the back-side of the semiconductor substrate, at a location laterally between the first region and the second region.

12. The BSI image sensor of claim 11, wherein the reflective material has a horizontal surface that is co-planar with the back-side of the semiconductor substrate.

13. The BSI image sensor of claim 11, further comprising:
    a third region having the second doping type, wherein the third region is arranged between the first region and the front-side of the semiconductor substrate;
    a fourth region having the second doping type, wherein the fourth region is arranged between the second region and the front-side of the semiconductor substrate; and
    wherein the transfer transistor gate is laterally arranged between the third region and the fourth region.

14. The BSI image sensor of claim 13, further comprising:
    a memory transistor gate arranged along the front-side of the semiconductor substrate over the fourth region; and
    a second transfer transistor gate arranged along the front-side of the semiconductor substrate at a position laterally separated from the transfer transistor gate by the memory transistor gate.

15. The BSI image sensor of claim 11, wherein the reflective material comprises a metal or a multi-layer reflective film.

16. The BSI image sensor of claim 11, wherein the reflective material has an angled sidewall that decreases a width of the reflective material as a distance from the back-side of the semiconductor substrate increases.

17. The BSI image sensor of claim 11, further comprising:
    a plurality of metal interconnect layers arranged within a dielectric structure disposed along the front-side of the semiconductor substrate.

18. A back-side illuminated (BSI) image sensor, comprising:
    an image sensing element arranged within a semiconductor substrate;

a gate structure arranged along a front-side of the semiconductor substrate between the image sensing element and a memory node arranged within the semiconductor substrate; and a reflective material embedded within the semiconductor substrate at a location vertically between the memory node and a plane extending along a back-side of the semiconductor substrate, wherein the reflective material has a sidewall that is laterally separated from the image sensing element by the semiconductor substrate.

19. The BSI image sensor of claim 18, further comprising:

a passivation layer having a surface facing the semiconductor substrate, wherein the surface contacts the back-side of the semiconductor substrate and the reflective material.

20. The BSI image sensor of claim 18, wherein the reflective material has a surface facing the front-side of the semiconductor substrate, which is vertically separated from the memory node by the semiconductor substrate.

* * * * *